United States Patent
Kim

(10) Patent No.: US 8,802,532 B2
(45) Date of Patent: Aug. 12, 2014

(54) BIPOLAR TRANSISTOR AND METHOD FOR MANUFACTURING THE SAME

(75) Inventor: Nam Joo Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/543,161

(22) Filed: Jul. 6, 2012

(65) Prior Publication Data

US 2013/0092939 A1    Apr. 18, 2013

(30) Foreign Application Priority Data

Oct. 14, 2011    (KR) .................. 10-2011-0105254

(51) Int. Cl.
*H01L 29/737* (2006.01)
*H01L 29/66* (2006.01)
*H01L 29/08* (2006.01)
*H01L 29/732* (2006.01)

(52) U.S. Cl.
CPC ...... *H01L 29/66272* (2013.01); *H01L 29/0821* (2013.01); *H01L 29/732* (2013.01)
USPC ........... 438/286; 438/312; 438/396; 438/523; 438/381; 438/309; 257/531; 257/197; 257/336; 257/303; 257/565; 257/E29.133; 257/E21.022; 257/E21.019; 257/E23.144; 257/E27.048

(58) Field of Classification Search
CPC ............ H01L 29/0821; H01L 29/1004; H01L 29/7322
USPC .................. 257/586, 593, E21.371, E29.174, 257/E29.188, 51, 300, 531, 296, 587, 286; 438/320, 350, 312
See application file for complete search history.

(56) References Cited

U.S. PATENT DOCUMENTS

2007/0152240 A1*    7/2007    Kim .............................. 257/197

FOREIGN PATENT DOCUMENTS

| JP | 2002-124522 | 4/2002 |
|---|---|---|
| KR | 10-0223482 | 10/1999 |
| KR | 10-1044779 | 6/2011 |

* cited by examiner

*Primary Examiner* — Jerome Jackson, Jr.
*Assistant Examiner* — Bo Fan
(74) *Attorney, Agent, or Firm* — Sherr & Jiang, PLLC

(57) ABSTRACT

Disclosed are example bipolar transistors capable of reducing the area of a collector, reducing the distance between a base and a collector, and/or reducing the number of ion implantation processes. A bipolar transistor may includes a trench formed by etching a portion of a semiconductor substrate. A first collector may be formed on the inner wall of the trench. A second collector may be formed inside the semiconductor substrate in the inner wall of the trench. A first isolation film may be formed on the sidewall of the first collector. An intrinsic base may be connected to the third collector. An extrinsic base may be formed on the intrinsic base and inside the first isolation film. A second isolation film may be formed on the inner wall of the extrinsic base. An emitter may be formed by burying a conductive material inside the second isolation film.

5 Claims, 7 Drawing Sheets

BIPOLAR TRANSISTOR AND METHOD FOR MANUFACTURING THE SAME

The present application claims priority to Korean Patent Application No. 10-2011-0105254 (filed on Oct. 14, 2011), which is hereby incorporated by reference in its entirety.

BACKGROUND

Bipolar junction transistors (BJTs) may have desirable features from the viewpoint of current performance, speed, and gain compared to MOS transistors (MOS TRs: Metal Oxide Semiconductor Transistors) and are often used in analog, power, and RFIC applications. Bipolar transistors having an emitter, a base, and a collector may be classified into vertical bipolar transistors or horizontal bipolar transistors, depending the travel direction of electric charges emitted from the emitter.

In general, a PN junction where a P-type semiconductor region and an N-type semiconductor region are in contact with each other in a semiconductor substrate exhibits a rectification characteristic, which is a basic constituent component of a semiconductor device. A bipolar junction transistor (BJT, hereinafter, referred to as a bipolar transistor) may have two layers of PN junctions. A forward bias may be applied to one PN junction of the bipolar transistor and a reverse bias may be applied to the other PN junction to induce movement of electrons and holes. In manufacturing an NPN bipolar transistor, an interval may be provided between an emitter and an extrinsic base to obtain a desired breakdown voltage.

A bipolar transistor in accordance with related art is illustrated in FIG. 1. FIG. 1 is a sectional view showing the structure of a bipolar transistor. In a semiconductor device having a bipolar transistor structure shown in FIG. 1, N-type sub collector 20 may be formed on the surface of P-type silicon substrate 10.

Epitaxial layer 30 may be formed on semiconductor substrate 10 including N-type sub collector 20. A device isolation film (not shown) may define an active region in epitaxial layer 30 and may be formed into epitaxial layer 30. Intrinsic base region 40 may be formed in the active region inside the device isolation film through P-type impurity ion implantation. Emitter region 50 may be formed in intrinsic base region 40 and extrinsic base region 52 may be formed in both sides of emitter region 50. Collector region 60 and emitter region 50 may be formed through N-type impurity ion implantation and the extrinsic base region 52 may be formed through P-type impurity ion implantation.

In the bipolar transistor of the related art having the above-described structure, the base-collector junction may be formed through ion implantation and diffusion. During the formation of the base-collector junction, the areas (a) and (b) of intrinsic base region 40 and collector region 60 may increase, resulting in the distance (c) between extrinsic base region 40 and collector region 60 increasing, which in turn causes an increase in the total transistor area.

In the bipolar transistor of the related art, since the base, the emitter, and the collector may be formed through an ion implantation process, photo masks are inevitably used for this process. Due to the necessity of using photo masks, the process complexity is relatively high, thus have negative effects on yield, performance, and manufacturing costs.

SUMMARY

Embodiments relate to a technique for manufacturing a semiconductor device. Particular embodiments relate to a bipolar transistor and a method for manufacturing a bipolar transistor capable of reducing the area of a collector, thereby reducing the distance between a base and a collector and/or reducing the number of ion implantation processes. Embodiments relate to a bipolar transistor and a method of manufacturing a bipolar transistor capable of reducing the number of photo masks.

Embodiments relate to a bipolar transistor and a method for manufacturing a bipolar transistor which form a base region using high-concentration P-type polysilicon, thereby minimizing a base area. In embodiments, a collector is formed through an N-type silicon epitaxial process and a spacer process using an insulating film, thereby minimizing a collector area. Embodiments relate to a bipolar transistor and a method for manufacturing a bipolar transistor capable of minimizing the distance between a base and a collector by forming a spacer on the inner wall of a trench.

In accordance with embodiments, a bipolar transistor may include at least one of: A trench formed by etching a portion of a semiconductor substrate. A first collector formed on the inner wall of the trench. A second collector formed inside the semiconductor substrate corresponding to the inner wall of the trench. A first spacer formed on the sidewall of the first collector. A third collector formed through impurity ion diffusion in the first collector exposed from the first spacer. An intrinsic base connected to the third collector. An extrinsic base formed on the intrinsic base and inside the first spacer. A second spacer formed on the inner wall of the extrinsic base. An emitter formed by burying a conductive material in the second spacer.

In embodiments, the bipolar transistor may include an emitter junction connected to the lower surface of the emitter and formed between the emitter and the intrinsic base. In embodiments, the bipolar transistor may include a base junction formed between the emitter junction and the third collector to surround the emitter junction.

The first collector may be an N-type epitaxial layer formed inside the trench through an N-type epitaxial growth process. The second collector may be a diffusion layer formed by diffusing an N-type impurity of the N-type epitaxial layer in the semiconductor substrate. The third collector may be a diffusion layer formed in the epitaxial layer formed through the N-type epitaxial growth process. The intrinsic base may be formed by implanting P-type impurity ions in the epitaxial layer. The extrinsic base may be formed by depositing polysilicon doped with P-type impurity ions. The second spacer may be formed by depositing an insulating film. The emitter may be formed by burying polysilicon doped with N-type impurity ions in a region inside the second spacer.

In accordance with embodiments, a method for manufacturing a bipolar transistor may include at least one of the following: (1) etching a portion of a semiconductor substrate using an etching mask exposing a portion of the semiconductor substrate to form a trench, (2) forming a first epitaxial layer through an epitaxial process using first conduction type impurity ions to form a first collector and a second collector into the semiconductor substrate adjacent to the first epitaxial layer, (3) forming a first spacer on the inner wall of the first epitaxial layer, (4) forming a second epitaxial layer into the first spacer through an epitaxial process on the first epitaxial layer exposed from the first spacer to form a third collector, (5) forming an extrinsic base on the inner wall of the first spacer, (6) forming an insulating film on the entire surface of the semiconductor substrate in which the extrinsic base is formed, (7) performing an ion implantation process using second conduction type impurity ions to form an intrinsic base into the second epitaxial layer, (8) etching the insulating film to form a second spacer on the inner wall of the extrinsic base, and (9) forming an emitter inside the second spacer.

In embodiments, the forming the extrinsic base may include forming a second conduction type polysilicon film on the entire surface of the semiconductor substrate, in which the first spacer is formed, and performing an anisotropic dry etching process on the second conduction type polysilicon film to form the extrinsic base on the inner wall of the first spacer. In embodiments, the forming the intrinsic base (after forming the insulating film) may include implanting the second conduction type impurity ions in the surface of the second epitaxial layer through a blanket ion implantation process to form the intrinsic base.

In embodiments, the forming the emitter may include at least one of: (1) depositing first conduction type polysilicon to completely cover the etching mask, (2) performing a CMP process such that the upper surface of the etching mask is exposed to planarize the first conduction type polysilicon, (3) performing an oxidization process on a region exposed from the etching mask to form an oxide film, and (4) removing the oxide film and the etching mask to form the emitter.

In embodiments, said forming the oxide film may further include performing a heat treatment process to form an emitter junction and a base junction, which would be performed after forming the oxide film. Embodiments may include (1) removing the oxide film, (2) forming an insulating interlayer, (4) patterning the insulating interlayer to form a contact hole, and (5) filling a metal material in the contact hole to form an electrode.

In embodiments, a bipolar transistor is formed using spacers of a high-concentration silicon epitaxial layer and an insulating film, thereby reducing the area of the collector and reducing the distance between the base and the collector. Further, in embodiments, a bipolar transistor is formed using an epitaxial process and polysilicon doped with an impurity, thereby reducing the number of ion implantation processes.

Objects of the embodiments are not limited to those mentioned above, and other objects of the embodiments will be apparently understood by those skilled in the art through the following description.

BRIEF DESCRIPTION OF THE DRAWINGS

The above and other features of embodiments will become apparent from the following description in conjunction with the accompanying drawings, in which.

DETAILED DESCRIPTION

Figure 1:
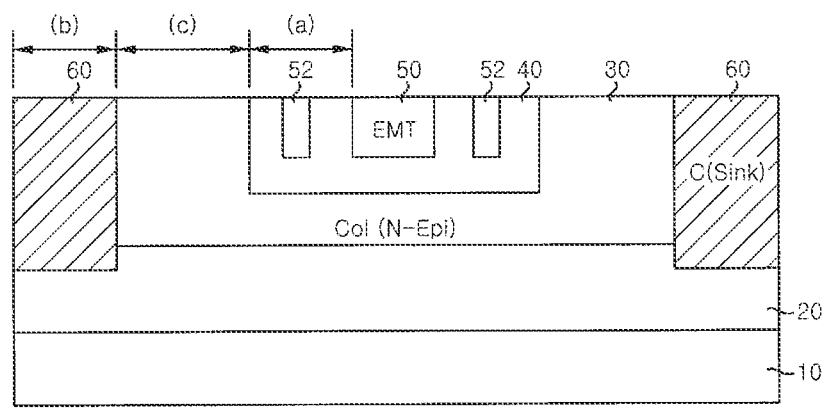
FIG. 1 is a cross sectional view showing the structure of a bipolar transistor in accordance with the related art.

Advantages and features of embodiments and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification. The structure of a bipolar transistor and a method for manufacturing a bipolar transistor in accordance with embodiments will be described in detail with reference to the accompanying drawings.

Figure 2:
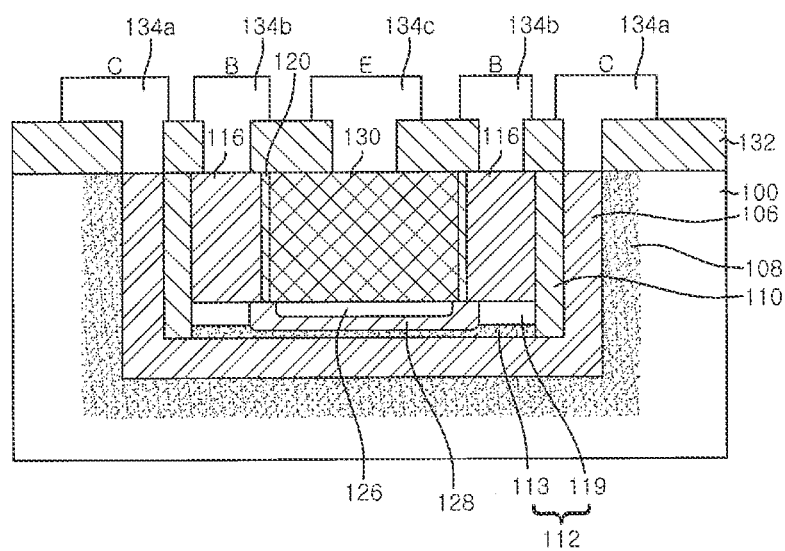
FIG. 2 is a cross sectional view showing the structure of a bipolar transistor in accordance with embodiments.

FIG. 2 is a cross sectional view showing the structure of a bipolar transistor in accordance with embodiments. A bipolar transistor in accordance with embodiments may include: (1) a first epitaxial layer 106, serving as a first collector, which may be formed on the inner wall of a trench formed by etching a portion of a semiconductor substrate 100; (2) a first diffusion layer 108, which may serve as a second collector, which may be formed inside the semiconductor substrate 100 in the inner wall of the trench; (3) a first spacer 110 which may be formed on the sidewall of the first collector to isolate an extrinsic base from the first collector; (4) a second diffusion layer 113 and an intrinsic base 119 inside first spacer 110 which may be formed into a second epitaxial layers generated through a growth process on the first epitaxial layer 106; (5) an extrinsic base 116 which is formed inside the first spacer 110 and made of polysilicon doped with high-concentration P-type (P+) impurity ions, (6) a second spacer 120 which is formed inside the extrinsic base 116; and (7) an emitter 130 formed by burying an N-type conductive material in the second spacer 120.

In embodiments, first epitaxial layer 106 is formed through an epitaxial process using high-concentration N-type impurity ions. During the epitaxial process, N-type impurity ions may be diffused in the semiconductor substrate 100 inside the trench to form the first diffusion layer 108 serving as a second collector. First spacer 110 may be formed on/over the sidewall of first epitaxial layer 106 by depositing silicon oxide and then blanket etching process. After forming first spacer 110, second epitaxial layer 112 may be formed through an epitaxial process.

In embodiments, a portion of second epitaxial layer 112 may be formed on/over first epitaxial layer 106 between first spacers 110, shown as second diffusion layer 113. Second diffusion layer 113 may be formed (in embodiments) using N-type impurity ions doped in the first epitaxial layer 106, which may be defined by first spacers 110. In embodiments, second diffusion layer 113 may serve as a third collector.

In embodiments, intrinsic base 119 may be formed on/over second diffusion layer 113 in portion(s) of the region of the second epitaxial layer 112 between first spacers 110, such that intrinsic base 119 in adjacent to first spacers 110. Intrinsic base 119 may be formed by depositing an insulating film for forming second spacer 120 and then performing a blanket ion implantation process using low-concentration p-type impurity ions, in accordance with embodiments. In embodiments, intrinsic base 119 may be formed in the upper region adjacent to second diffusion layer 113 in the internal region of second epitaxial layer 112.

Second spacer 120 may isolate emitter 130 from extrinsic base 116. In embodiments, second spacer 120 may be formed on the inner wall of extrinsic base 116. In embodiments, emitter 130 may be formed by burying a conductive material doped with high-concentration N-type (N+) impurity ions (e.g. forming polysilicon) in a region inside second spacers 120 and then optionally performing a CMP process.

Extrinsic base 116 may be formed on the inner wall of first spacer 110. In embodiments, extrinsic base 116 may be formed by depositing polysilicon (which is a conductive material doped with high-concentration P-type impurity ions) and then etching the polysilicon through an anisotropic etching process.

The bipolar transistor in accordance with the embodiments may include emitter junction 126. In embodiments, emitter junction 126 may be formed through a heat treatment process after forming emitter 130 and may be connected to the lower surface of emitter 130. In embodiments, base junction 128, emitter electrode 134a, base electrode 134b, and collector electrode 134c may be formed by patterning insulating interlayer 132 and burying metal material. Emitter junction 126 may be connected to the lower surface of emitter 130, and is formed between emitter 130 and intrinsic base 119. Base junction 128 may be formed between emitter junction 126 and second diffusion layer 113. Base junction 128 may serve as a third collector to surround the emitter junction 126.

With the bipolar transistor in accordance with embodiments, the base and the collector may be isolated from each other by the first spacer 110 and second spacer 120, thereby minimizing the distance between the base and the collector.

Extrinsic base 116 may be formed using polysilicon doped with high-concentration P+ impurity ions, thereby reducing the occupying area of extrinsic base 116 in the bipolar transistor, in accordance with embodiments. In embodiments, extrinsic base 116 and emitter 130 are isolated from each other by second spacer 120, thereby minimizing the occupying area of extrinsic base 116 and emitter 130. In embodiments, second spacer 120 may include a nitride film.

A process for manufacturing the above-described bipolar transistor will be described with reference to FIGS. 3A to 3K, in accordance with embodiments. FIGS. 3A to 3K are cross sectional views of processes which illustrate example aspects of the processes for manufacturing a bipolar transistor, in accordance embodiments, which could be modified within the scope of embodiments by one of ordinary skill in the art.

Figure 3A:
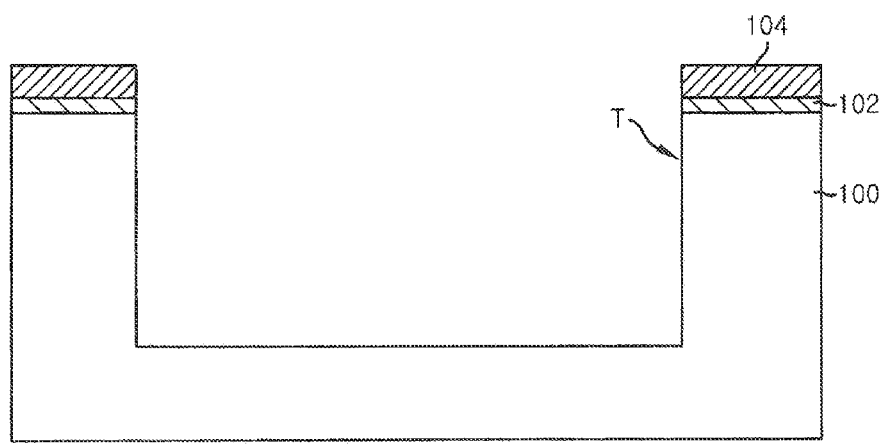
FIGS. 3A to 3K are cross sectional views of processes which respectively show each process for manufacturing a bipolar transistor in accordance with embodiments.

FIG. 3A illustrates first insulating film 102 and second insulating film 104 are formed on/over semiconductor substrate 100, in accordance with embodiments. Insulating film 102 and insulating film 104 may be etched such that a portion of semiconductor substrate 100 is exposed. This exposed portion may be the region where a bipolar transistor will be formed in subsequent processes. First insulating film 102 may be a silicon oxide film, in accordance with embodiments. Second insulating film 104 may be a silicon nitride film, in accordance with embodiments. Semiconductor substrate 100 may be etched at a predetermined depth through an etching process. Etched first and second insulating films 102 and 104 may be used as a mask to form trench T.

Figure 3B:
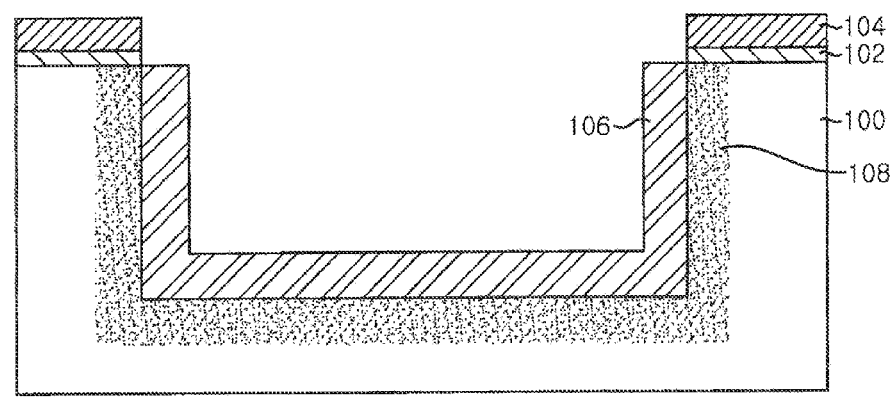

FIG. 3B illustrates a high-concentration N-type impurity epitaxial growth process performed on the surface of trench T to form first epitaxial layer 106 made of a high-concentration N-type impurity on the surface of trench T, in accordance with embodiments. First epitaxial layer 106 may be a silicon layer which may be formed through growth on silicon semiconductor substrate 100. In embodiments, first epitaxial layer 106 may be used as a first collector. In embodiments, during a heat treatment process for forming first epitaxial layer 106, N-type first diffusion layer 108 may be formed into semiconductor substrate 100 adjacent to first epitaxial layer 106. First diffusion layer 108 may be used as a second collector, in accordance with embodiments.

Figure 3C:
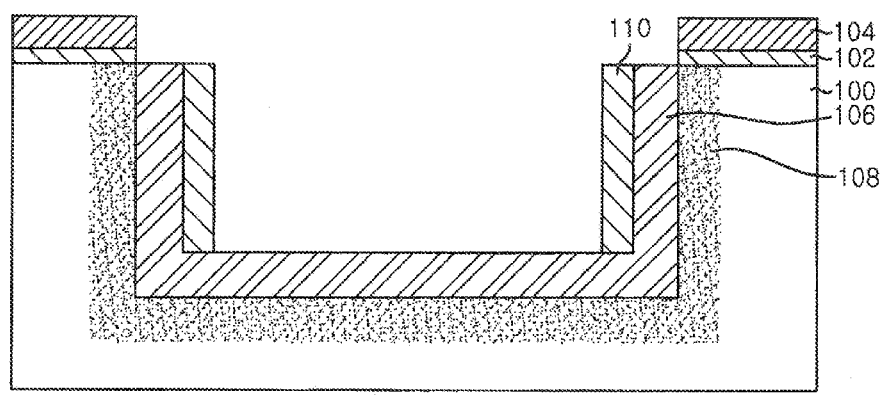

FIG. 3C illustrates an insulating film deposited on the first epitaxial layer 106 in accordance with embodiments. In embodiments, an blanket etching process may be performed to form first spacer 110 on the inner wall of first epitaxial layer 106. First spacer 110 may used as an isolation film which isolates the first epitaxial layer 106 from extrinsic base 116 (to be formed in a subsequent process).

Figure 3D:
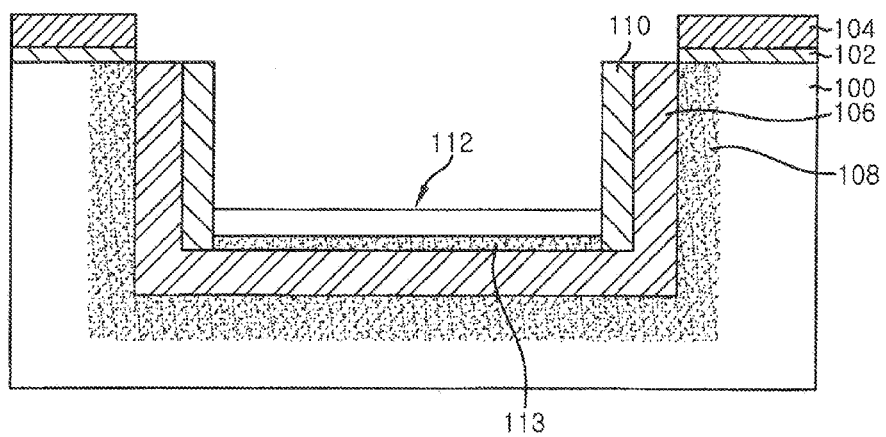

FIG. 3D illustrates an epitaxial process which may be performed on first epitaxial layer 106 to form second epitaxial layer 112, in accordance with embodiments. In embodiments second epitaxial layer 112 may be formed on first epitaxial layer 106 (made of a high-concentration N-type impurity materials) and inside first spacer 110. In embodiments, N-type second diffusion layer 113 may be formed through diffusion of N-type impurity materials of first epitaxial layer 106. N-type second diffusion layer 113 may be formed between second epitaxial layer 112 and first epitaxial layer 106, in accordance with embodiments. N-type second diffusion layer 113 may be used as a third collector in a semiconductor device, in accordance with embodiments.

Figure 3E:
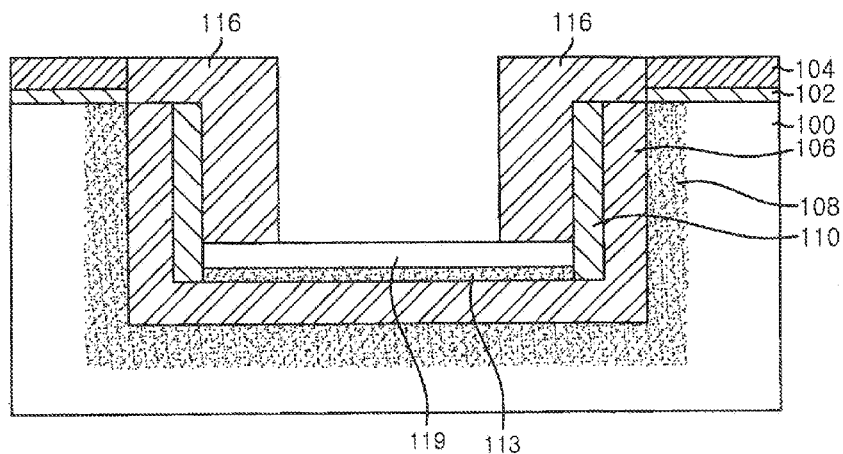

FIG. 3E illustrates, polysilicon doped with a P-type impurity deposited and blanket etched to form polysilicon layer 116 for an extrinsic base on/over the inner wall of first spacer 110.

Figure 3F:
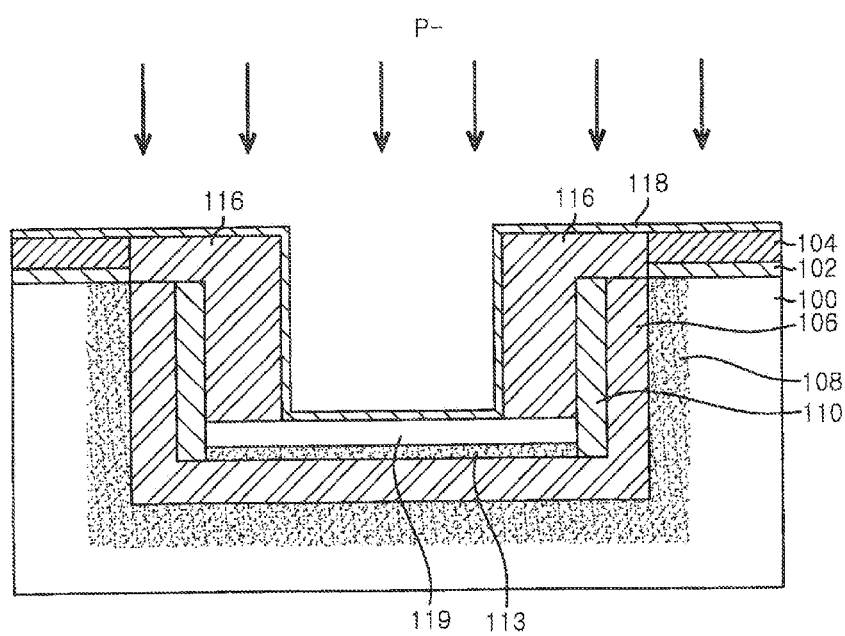

FIG. 3F illustrates insulating film 118 formed on/over the polysilicon layer 116 (for an extrinsic base) is formed, in accordance with embodiments. In embodiments, a blanket ion implantation process using low-concentration P-type impurity ions may be performed by implanting P-type impurity ions in the second epitaxial layer 112, thereby forming intrinsic base 119.

Figure 3G:
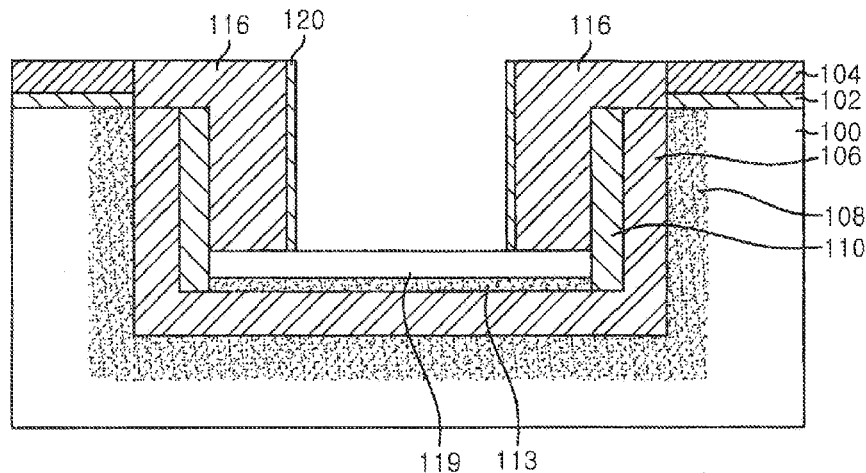

FIG. 3G illustrates a blanket etching process performed on insulating film 118 to form second spacer 120 on the inner wall of polysilicon layer 116 for an extrinsic base, in accordance with embodiments. In embodiments, second spacer 120 may be used as an isolation film which isolates the extrinsic base from the emitter.

Figure 3H:
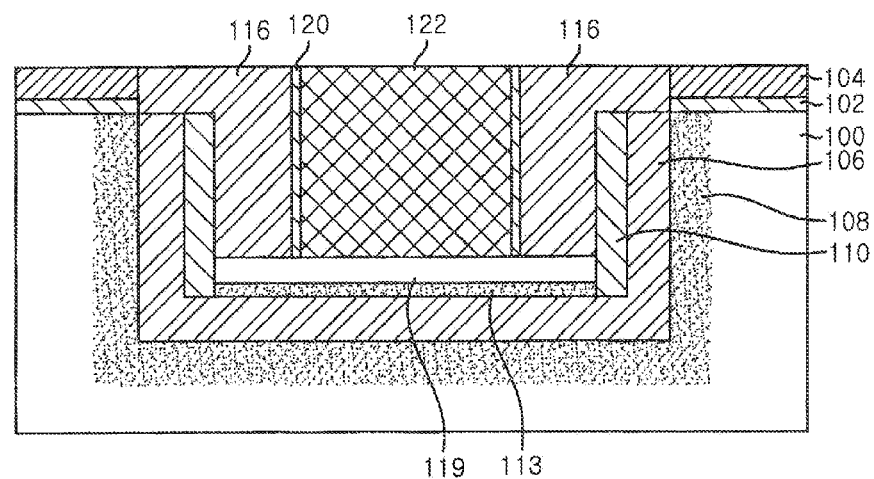

FIG. 3H illustrates polysilicon doped with high-concentration N-type (N+) impurity ions that are deposited to completely fill a region exposed from the second spacer 120, in accordance with embodiments. In embodiments, a CMP process may be performed with second insulating film 104 acting as a polishing stop layer to form polysilicon layer 122 for an emitter.

Figure 3I:
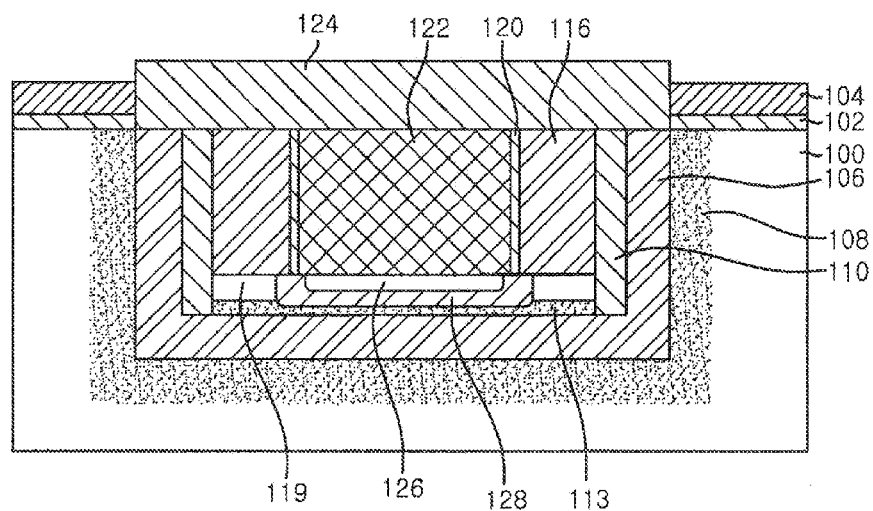

FIG. 3I illustrates an oxidization process performed on a region exposed by second insulating film 104 to form oxide film 124, in accordance with embodiments. In embodiments, an annealing process is performed to form the emitter and base junctions 126 and 128. In embodiments, emitter junction 126 may be formed to be connected to the lower surface of polysilicon layer 122 for an emitter. In embodiments, base junction 128 may be formed to be connected to emitter junction 126.

Figure 3J:
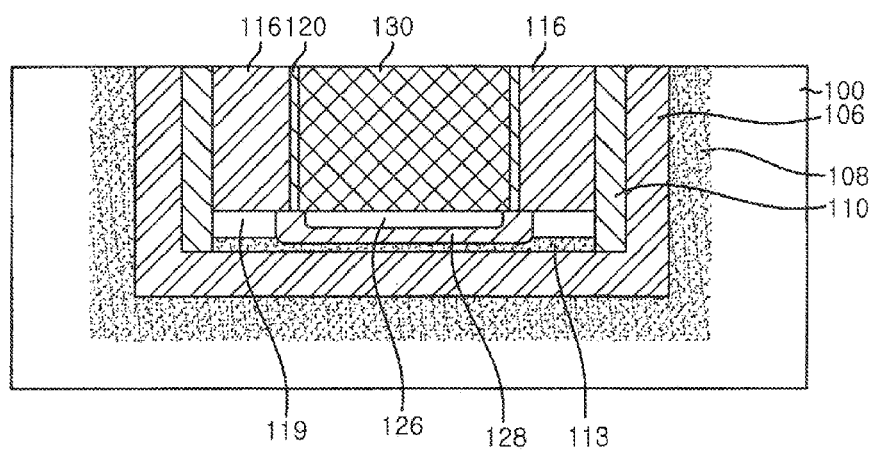

FIG. 3J illustrates an overall etching process performed to remove oxide film 124 first insulating film 102, and second insulating film 104 to form emitter 130 and extrinsic base 116 made of polysilicon doped with high-concentration N-type (N+) impurity ions, in accordance with embodiments.

Figure 3K:
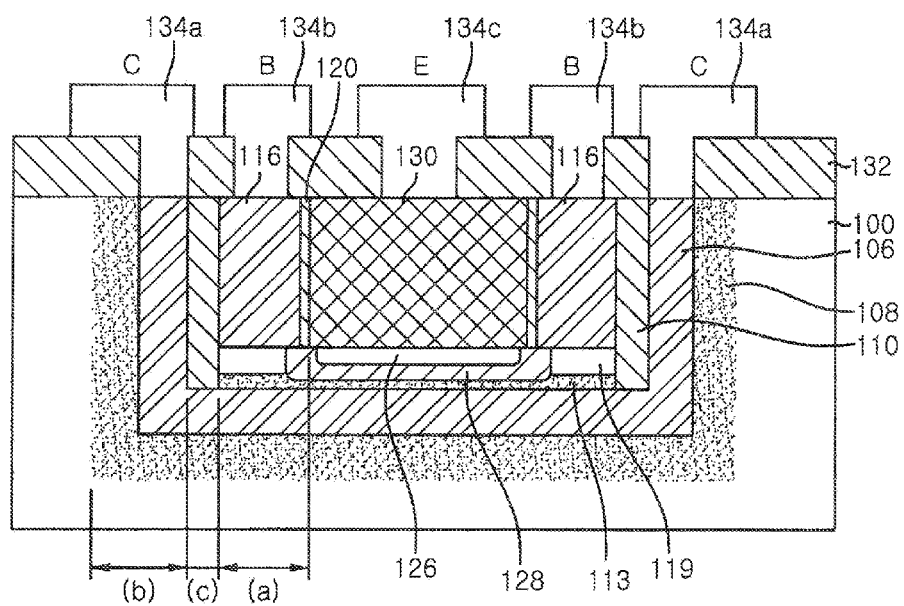

FIG. 3K illustrates insulating interlayer 132 formed on/over semiconductor substrate 100 in which emitter 130 is formed, in accordance with embodiments. In embodiments, insulating interlayer 132 is patterned to form a contact hole. In embodiments, a metal material may be filed into the contact hole to form collector electrode 134a, base electrode 134b, and emitter electrode 134c.

As described above, embodiments relate to a bipolar transistor and a method of manufacturing a bipolar transistor. In embodiments, a bipolar transistor may be formed using spacers of a high-concentration silicon epitaxial layer and an insulating film, thereby reducing the area "b" of the collector and reducing the distance "c" between the base and the collector and the distance "a" between the base and the emitter. In accordance with embodiments, a bipolar transistor may be formed using an epitaxial process and polysilicon doped with an impurity, thereby minimizing the number of ion implantation processes.

While the invention has been shown and described with respect to the embodiments, it will be understood by those skilled in the art that various changes and modifications may be made without departing from the scope of the invention as defined in the following claims.

What is claimed is:

1. A method for manufacturing a bipolar transistor, the method comprising:
   etching a portion of a semiconductor substrate to form a trench, using an etching mask exposing a portion of the semiconductor substrate;
   forming a first epitaxial layer on the surface of the trench through an epitaxial process using first conduction type impurity ions to form a first collector;
   forming a second collector into the semiconductor substrate adjacent to the first epitaxial layer by diffusion of the first epitaxial layer;
   forming a first spacer on the inner wall of the first epitaxial layer;
   forming a second epitaxial layer to form a third collector, wherein the second epitaxial layer is formed over the first epitaxial layer and inside the first spacer, wherein the second epitaxial layer is formed through an epitaxial process over the first epitaxial layer exposed by the first spacer;
   forming an extrinsic base on the inner wall of the first spacer, wherein said forming the extrinsic base includes forming a second conduction type polysilicon film on the entire surface of the semiconductor substrate in which the first spacer is formed and performing an anisotropic dry etching process on the second conduction type polysilicon film to form the extrinsic base on the inner wall of the first spacer;
   forming an insulating film over the entire surface of the semiconductor substrate, in which the extrinsic base is formed;
   performing an ion implantation process using second conduction type impurity ions to form an intrinsic base in the second epitaxial layer;
   etching the insulating film to form a second spacer on the inner wall of the extrinsic base; and
   forming an emitter inside the second spacer.

2. A method for manufacturing a bipolar transistor, the method comprising:
   etching a portion of a semiconductor substrate to form a trench, using an etching mask exposing a portion of the semiconductor substrate;
   forming a first epitaxial layer through an epitaxial process using first conduction type impurity ions to form a first collector and a second collector, wherein the second collector is formed into the semiconductor substrate;
   forming a first spacer on the inner wall of the first epitaxial layer;
   forming a second epitaxial layer to form a third collector, wherein the second epitaxial layer is formed over the first epitaxial layer and inside the first spacer, wherein the second epitaxial layer is formed through an epitaxial process over the first epitaxial layer exposed by the first spacer;
   forming an extrinsic base on the inner wall of the first spacer;
   forming an insulating film over the entire surface of the semiconductor substrate, in which the extrinsic base is formed;
   performing an ion implantation process using second conduction type impurity ions to form an intrinsic base in the second epitaxial layer, wherein in said forming the intrinsic base, after forming the insulating film, the second conduction type impurity ions are implanted in the surface of the second epitaxial layer through a blanket ion implantation process to form the intrinsic base;
   etching the insulating film to form a second spacer on the inner wall of the extrinsic base; and
   forming an emitter inside the second spacer.

3. A method for manufacturing a bipolar transistor, the method comprising:
   etching a portion of a semiconductor substrate to form a trench, using an etching mask exposing a portion of the semiconductor substrate;
   forming a first epitaxial layer through an epitaxial process using first conduction type impurity ions to form a first collector and a second collector, wherein the second collector is formed into the semiconductor substrate;
   forming a first spacer on the inner wall of the first epitaxial layer;
   forming a second epitaxial layer to form a third collector, wherein the second epitaxial layer is formed over the first epitaxial layer and inside the first spacer, wherein the second epitaxial layer is formed through an epitaxial process over the first epitaxial layer exposed by the first spacer;
   forming an extrinsic base on the inner wall of the first spacer;
   forming an insulating film over the entire surface of the semiconductor substrate, in which the extrinsic base is formed;
   performing an ion implantation process using second conduction type impurity ions to form an intrinsic base in the second epitaxial layer;
   etching the insulating film to form a second spacer on the inner wall of the extrinsic base; and
   forming an emitter inside the second spacer, wherein said forming the emitter includes:
      depositing first conduction type polysilicon to completely cover the etching mask,
      performing a CMP process such that the upper surface of the etching mask is exposed to planarize the first conduction type polysilicon,
      performing an oxidization process on a region exposed by the etching mask to form an oxide film, and
      removing the oxide film and the etching mask to form the emitter.

4. The method of claim 3, wherein said forming the oxide film further includes performing a heat treatment process to forming an emitter function and a base junction after forming the oxide film.

5. The method of claim 4, comprising:
   removing the oxide film and then forming an insulating interlayer; and
   patterning the insulating interlayer for form a contact hole and then burying a metal material in the contact hole to form an electrode.

* * * * *